(12) United States Patent
Wang et al.

(10) Patent No.: US 8,354,038 B2
(45) Date of Patent: Jan. 15, 2013

(54) PIEZOELECTRIC CERAMIC, AND PIEZOELECTRIC, DIELECTRIC OR PYROELECTRIC ELEMENT USING THE SAME

(75) Inventors: Ruiping Wang, Ibaraki (JP); Hiroshi Bando, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/451,495

(22) PCT Filed: May 16, 2008

(86) PCT No.: PCT/JP2008/059007
§ 371 (c)(1),
(2), (4) Date: Mar. 26, 2010

(87) PCT Pub. No.: WO2008/143160
PCT Pub. Date: Nov. 27, 2008

(65) Prior Publication Data
US 2010/0187466 A1      Jul. 29, 2010

(30) Foreign Application Priority Data

May 16, 2007   (JP) ................... 2007-131075
Oct. 10, 2007   (JP) ................... 2007-263955

(51) Int. Cl.
*C04B 35/00*   (2006.01)
(52) U.S. Cl. ............................. 252/62.9 PZ
(58) Field of Classification Search ............. 252/62.9 R, 252/62.9 PZ; 310/358; 501/134–137
See application file for complete search history.

(56) References Cited

U.S. PATENT DOCUMENTS

| | | | | |
|---|---|---|---|---|
| 5,259,885 | A * | 11/1993 | Sandhage | 505/450 |
| 2004/0058797 | A1 | 3/2004 | Nonoyama et al. | |
| 2005/0109263 | A9 * | 5/2005 | Chiang et al. | 117/47 |
| 2006/0006360 | A1 * | 1/2006 | Takao et al. | 252/62.9 R |
| 2007/0120446 | A1 * | 5/2007 | Yamazaki et al. | 310/358 |
| 2007/0205389 | A1 * | 9/2007 | Kurozumi et al. | 252/62.9 R |
| 2008/0239627 | A1 * | 10/2008 | Bridger et al. | 361/321.5 |
| 2011/0291522 | A1 * | 12/2011 | Kounga Njiwa et al. | 310/311 |

FOREIGN PATENT DOCUMENTS

| | | |
|---|---|---|
| JP | 2004-244300 | 9/2004 |
| JP | 2005-8516 | 1/2005 |
| JP | 2006206429 A * | 8/2006 |
| WO | WO 2004106264 A1 * | 12/2004 |
| WO | WO 2005021461 A1 * | 3/2005 |
| WO | 2006/117990 | 11/2006 |

OTHER PUBLICATIONS

Machine translation of JP2006-206429A.*
International Search Report issued Aug. 12, 2008 in International (PCT) Application No. PCT/JP2008/059007.

* cited by examiner

*Primary Examiner* — Emily Le
*Assistant Examiner* — Lynne Edmondson
(74) *Attorney, Agent, or Firm* — Wenderoth, Lind & Ponack, L.L.P.

(57) ABSTRACT

A piezoelectric solid solution composition containing, as a main component, a composition represented by the following general formula:

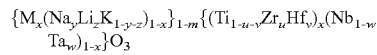

is disclosed. In the formula, M represents a combination of at least one member selected from the group consisting of ($Bi_{0.5}K_{0.5}$), ($Bi_{0.5}Na_{0.5}$) and ($Bi_{0.5}Li_{0.5}$) and at least one member selected from the group consisting of Ba, Sr, Ca and Mg; and in the formula, x, y, z, u, v, w and m are in the following ranges: $0.06 < x \leq 0.3$, $0 \leq y \leq 1$, $0 \leq z \leq 0.3$, $0 \leq (y+z) \leq 1$, $0 < u \leq 1$, $0 \leq v \leq 0.75$, $0 \leq w \leq 0.2$, $0 < (u+v) \leq 1$ and $-0.06 \leq m \leq 0.06$. This solid solution composition preferably forms the same rhombohedral-tetragonal morphotropic phase boundary as in PZT, is environmentally friendly, and displays an excellent piezoelectric constant $d_{33}$.

14 Claims, 2 Drawing Sheets

PIEZOELECTRIC CERAMIC, AND PIEZOELECTRIC, DIELECTRIC OR PYROELECTRIC ELEMENT USING THE SAME

TECHNICAL FIELD

This invention relates to a lead-free piezoelectric solid solution composition composed mainly of sodium niobate ($NaNbO_3$) and potassium niobate ($KNbO_3$) which are a perovskite oxide, a piezoelectric ceramic obtained by sintering the same and a piezoelectric, dielectric or pyroelectric element using the subject ceramic.

BACKGROUND ART

Piezoelectric ceramics are used for various purposes as an actuator for ultrasonic vibrators, ultrasonic motors, precise positioning elements, piezoelectric transformers or the like because when a voltage is applied, they undergo elastic deformation; and also as a sensor of an acceleration sensor, a piezoelectric gyroscope for car navigation system, a sonar, an ultrasonic diagnostic element or the like because when deformation is conversely given, they generate a voltage. Recently, a tendency toward intelligence of various machines or systems has become strong, and for that reason, in particular, importance of the actuator is being enhanced. The mainstream of piezoelectric ceramics which are currently used for many purposes is one containing, as a main component, lead titanate zirconate (PZT) and assuming a perovskite structure ($ABO_3$).

Piezoelectric properties of this PZT ceramic are brought through a combination of lead zirconate ($PbZrO_3$) having a rhombohedral structure, which is an antiferroelectric substance, and lead titanate ($PbTiO_3$) having a tetragonal structure, which is a ferroelectric substance, and are the highest in a composition neighboring to a morphotropic phase boundary (MPB) between rhombohedral and tetragonal crystals (neighboring to $PbZO_3/PbTiO_3=52/48$). For that reason, many PZT based piezoelectric ceramics are used upon being prepared in a composition neighboring to MPB.

On the other hand, recently, there is a trend for reducing the amount of lead from various materials from the standpoint of a problem of global environmental pollution, and the piezoelectric ceramics are not exceptional.

In fact, almost all of piezoelectric ceramics which are currently used for many purposes and which are represented by PZT ceramics contain a large amount of lead. In particular, PZT contains a large amount of lead, and thus, in recent years, adverse influences against the global environment, such as elution of lead due to acid rain or the like, become problematic. In view of such circumstances, the development of lead-free based piezoelectric ceramic materials having characteristics comparable to PZT is desirable.

A piezoelectric porcelain composition represented by a general formula: $(Na,K)NbO_3$ has a high cubic-tetragonal phase transition temperature (Curie temperature $T_c$), and thus, in recent years, it is watched as a candidacy substance of the lead-free piezoelectric ceramic as a replacement of PZT (see Patent Documents 1 to 8 and Non-Patent Documents 1 to 9).

Also, $(Na,K)NbO_3$ has a perovskite structure, and when the temperature is changed from a high temperature to a low temperature, it causes sequential cubic-tetragonal-orthorhombic-rhombohedral phase transition.

From Non-Patents 1 to 9, a tetragonal-orthorhombic phase transition temperature ($T_{c2}$) can be shifted to a low temperature side by introducing $M_1M_2O_3$ (wherein $M_1$ represents an element such as Ba, Sr, Ca, Pb, Li or the like; and $M_2$ represents an element such as Ti, Ta, Sb, Nb or the like) into $(Na,K)NbO_3$.

In that case, as $T_{c2}$ becomes close to room temperature, the piezoelectric characteristic is improved and becomes maximum in the vicinity of an introduction amount of $M_1M_2O_3$ of from 3 to 6 mol %. It has been the mainstream for the conventional development of a niobium based lead-free piezoelectric ceramic to enhance the piezoelectric characteristic by selection of the elements and selection of the composition while utilizing this orthorhombic-tetragonal morphotropic phase boundary.

A gray portion in FIG. 1 shows a principal composition range of a conventional type niobium based lead-free piezoelectric ceramic utilizing this orthorhombic-tetragonal morphotropic phase boundary.

On the other hand, according to Non-Patent Document 10, it was clarified that in lead based materials $[(1-x)Pb(Zn_{1/3}Nb_{2/3})O_3$-$xPbTiO_3]$, the piezoelectric characteristic is optimized by a sample having a composition neighboring to a rhombohedral-tetragonal morphotropic phase boundary, which is caused due to the fact that electric polarization rotates toward the (001) direction of a tetragonal crystal from the (111) direction of a rhombohedral crystal through the orthorhombic crystal or tetragonal crystal by an externally applied electric field.

Assuming that the same polarization rotation also contributes to a orthorhombic-tetragonal morphotropic phase boundary of the lead-free niobium based material $(Na,K)NbO_3$, its change amount is merely partial as compared with a rhombohedral-orthorhombic-tetragonal change in lead based materials.

In consequence, it was considered that in the niobium based material, so far as this orthorhombic-tetragonal morphotropic phase boundary is utilized, the development of a lead-free piezoelectric ceramic having a piezoelectric characteristic comparable to lead based materials is accompanied with difficulty.

Patent Document 1: JP-A-2006206429
Patent Document 2: Japanese Patent Application No. 2005-502701
Patent Document 3: Japanese Patent Application No. 2005-513469
Patent Document 4: JP-A-2004-300012
Patent Document 5: Japanese Patent No. 3654408
Patent Document 6: Japanese Patent No. 3282576
Patent Document 7: Japanese Patent No. 3259677
Patent Document 8: Japanese Patent No. 3259678
Non-Patent Document 1: Jpn. J. Appl. Phys., 41, 7119 (2002)
Non-Patent Document 2: Ferroelectrics, 286, 93 (2003)
Non-Patent Document 3: Appl. Phys. Lett, 85, 4121 (2004)
Non-Patent Document 4: Jpn. J. Appl. Phys. Part 1, 43, 6662 (2004)
Non-Patent Document 5: Nature, 432, 84 (2004)
Non-Patent Document 6: Solid State Commun., 129, 274 (2004)
Non-Patent Document 7: Mat. Letts., 59, 241 (2005)
Non-Patent Document 8: phys. stat. sol. (a), 202, R57 (2005)
Non-Patent Document 9: Appl. Phys. Lett., 90, 092904 (2007)
Non-Patent Document 10: Nature, 403, 281 (2000)

DISCLOSURE OF INVENTION

Problems that the Invention is to Solve

In view of the foregoing problems, this invention has been made, and its object is to provide a novel solid solution composition composed mainly of (Na,K)NbO$_3$, which preferably forms the same rhombohedral-tetragonal morphotropic phase boundary as in PZT and is environmentally friendly, a piezoelectric ceramic obtained from the same and a piezoelectric, dielectric or pyroelectric element using the subject ceramic.

Means for Solving the Problems

In order to solve the foregoing problems, the present inventors made extensive and intensive investigations. As a result, they have attained this invention.

That is, this application provides the following inventions.
(1) A piezoelectric solid solution composition comprising, as a main component, a composition represented by the following general formula:

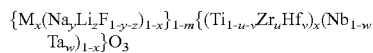

(In the formula, M represents a combination of at least one member selected from the group consisting of (Bi$_{0.5}$K$_{0.5}$), (Bi$_{0.5}$Na$_{0.5}$) and (Bi$_{0.5}$Li$_{0.5}$) and at least one member selected from the group consisting of Ba, Sr, Ca and Mg; and x, y, z, u, v, w and m are in the following ranges: $0.06 < x \leq 0.3$, $0 \leq y \leq 1$, $0 \leq z \leq 0.3$, $0 \leq (y+z) \leq 1$, $0 < u \leq 1$, $0 \leq v \leq 0.75$, $0 \leq w \leq 0.2$, $0 < (u+v) \leq 1$ and $-0.06 \leq m \leq 0.06$.)
(2) The piezoelectric solid solution composition as set forth in (1), which has a rhombohedral-tetragonal morphotropic phase boundary.
(3) A piezoelectric solid solution composition comprising the piezoelectric solid solution composition as set forth above in (1) or (2) having at least one metal selected among Ba, Bi, Ca, Ce, Cr, Cu, Dy, Er, Eu, Ga, Gd, Ge, Ho, In, La, Lu, Mn, Nd, Pr, Sc, Si, Sm, Sn, Sr, Tb, Tm, V, W, Y and Yb or a metal compound thereof further added thereto.
(4) A piezoelectric ceramic obtained by sintering the piezoelectric solid solution composition as set forth above in any one of (1) to (3).
(5) A dielectric ceramic obtained by sintering the piezoelectric solid solution composition as set forth above in any one of (1) to (3).
(6) A pyroelectric ceramic obtained by sintering the piezoelectric solid solution composition as set forth above in any one of (1) to (3).
(7) The piezoelectric ceramic as set forth in (4), which has a relative density of 95% or more.
(8) The dielectric ceramic as set forth in (5), which has a relative density of 95% or more.
(9) The pyroelectric ceramic as set forth in (6), which has a relative density of 95% or more.
(10) A piezoelectric element containing the piezoelectric ceramic as set forth above in (4) or (7).
(11) A dielectric element containing the piezoelectric ceramic as set forth above in (5) or (8).
(12) A pyroelectric element containing the piezoelectric ceramic as set forth above in (6) or (9).

Advantages of the Invention

The piezoelectric ceramic of this invention is a high-performance piezoelectric ceramic material which is free from lead and environmentally friendly. The ceramic of this invention displays an excellent piezoelectric constant d$_{33}$, and thus, it can be utilized as an actuator for ultrasonic vibrators, ultrasonic motors, precise positioning elements, piezoelectric transformers or the like and also as a vibration control actuator for airplanes, automobiles, railway vehicles, ships or the like or as a vibration-proof actuator for civil engineering and construction buildings.

In niobium based materials, this invention has first enhanced the piezoelectric characteristic due to the fact that a rhombohedral-tetragonal morphotropic phase boundary is formed at room temperature and is expected to give a guideline for the development of niobium based lead-free piezoelectric ceramics in the future. Also, the development of niobium based lead-free piezoelectric ceramics in the future may be performed while focusing on a composition region of MPB which has been found out by this invention, without relying upon plane search up to date, and thus, realization of high efficiency of the development is expected.

BEST MODE FOR CARRYING OUT THE INVENTION

Figure 1:
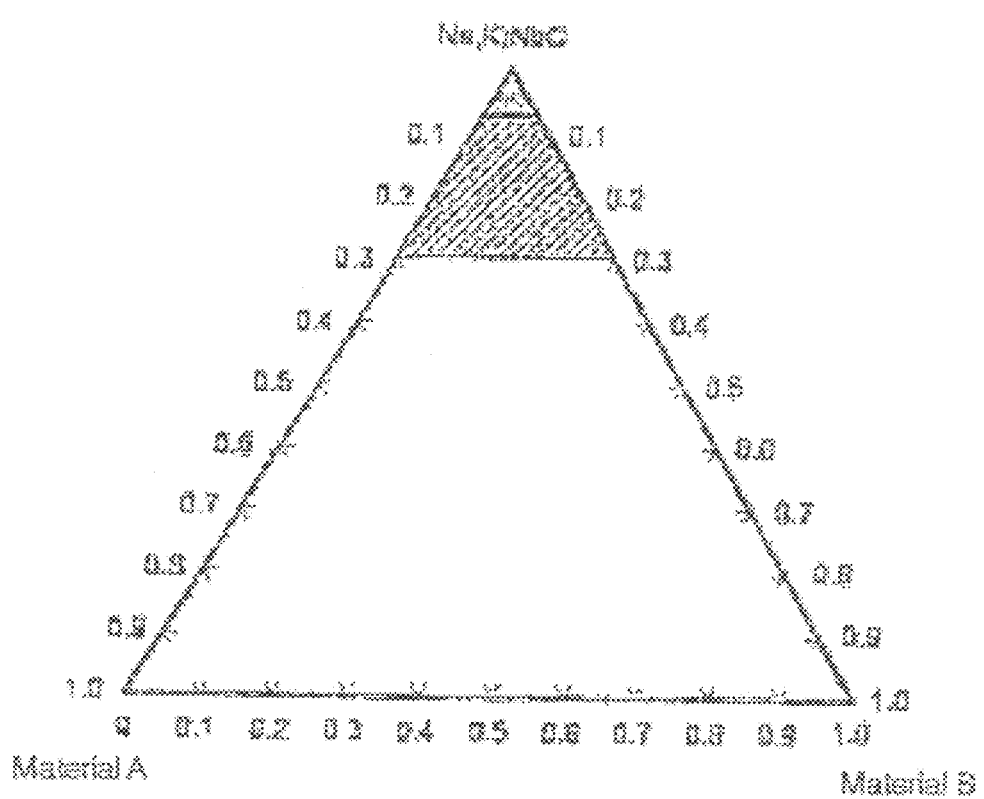
FIG. 1 is a diagrammatic explanatory view of a conventional composition range and a composition range of this invention in niobium based lead-free piezoelectric ceramics. A gray part thereof shows the conventional composition range, and a diagonal part thereof shows the composition range of this invention.

The piezoelectric solid solution composition according to this invention comprises, as a main component, a composition represented by the following general formula:

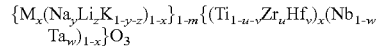

In the formula, M represents a combination of at least one member selected from the group consisting of (Bi$_{0.5}$K$_{0.5}$), (Bi$_{0.5}$Na$_{0.5}$) and (Bi$_{0.5}$Li$_{0.5}$) and at least one member selected from the group consisting of Ba, Sr, Ca and Mg; and x, y, z, u, v, w and m are in the following ranges: $0.06 < x \leq 0.3$, $0 \leq y \leq 1$, $0 \leq z \leq 0.3$, $0 \leq (y+z) \leq 1$, $0 < u \leq 1$, $0 \leq v \leq 0.75$, $0 \leq w \leq 0.2$, $0 < (u+v) \leq 1$ and $-0.06 \leq m \leq 0.06$.

A first characteristic feature of the composition represented by the foregoing general formula according to this invention resides in the fact that the composition does not contain noxious lead. For that reason, the composition according to this invention is free from volatilization of a lead component and run-off of lead from wastes or the like in the manufacturing process and safe. Also, an environmental measure for the purpose of not discharging lead into the external environment is unnecessary, and thus, the composition according to this invention is advantageous from the standpoint of costs.

A second characteristic feature of the composition represented by the foregoing general formula according to this invention resides in the fact that u is in the range of $0 < u \leq 1$. That is, the second characteristic feature resides in the fact that Zr is chosen as an essential component of the B site for the purpose of forming a rhombohedral-tetragonal morphotropic phase boundary. Though it is known that (Na,K)NbO$_3$ displays a rhombohedral structure only at a low temperature (for example, not higher than about $-150°$ C. in the case of (Na$_{0.5}$K$_{0.5}$)NbO$_3$), one having a rhombohedral structure in the vicinity of room temperature has not been known yet. The present inventors made extensive and intensive investigations regarding a structure capable of keeping the low-temperature rhombohedral structure of (Na,K)NbO$_3$ even at room temperature or higher by a technique such as element substitution or the like. As a result, they have attained knowledge that it is extremely effective to introduce 6 mol % or more of Zr into the B site of the perovskite.

Reasons for this have not been elucidated yet at present, it is presumed that an ion radius of Zr is larger than that of Nb.

A third characteristic feature of the composition represented by the foregoing general formula according to this invention resides in the fact that the A site contains Li and/or the B site contains at least one of Ti and Ta. These components are introduced such that the solid solution composition according to this invention points to a perovskite tetragonal structure at room temperature.

A fourth characteristic feature of the composition represented by the foregoing general formula according to this invention resides in the fact that a combination of at least one member selected from the group consisting of $(Bi_{0.5}K_{0.5})$, $(Bi_{0.5}Na_{0.5})$ and $(Bi_{0.5}Li_{0.5})$ and at least one member selected from the group consisting of Ba, Sr, Ca and Mg is used as an essential component of the A site. By introducing these components into the A site, it is possible to keep electrical neutrality with the foregoing Zr component or Ti and Hf components.

In consequence, it is ratiocinated that due to the fact that the solid solution composition of this invention has the foregoing second characteristic feature, third characteristic feature and fourth characteristic feature at the same time, it is possible to form a rhombohedral-tetragonal morphotropic phase boundary at room temperature.

An outline of a conventional composition range and a composition range of this invention in niobium based lead-free piezoelectric ceramics is shown in FIG. 1. A gray portion in FIG. 1 shows a principle composition range of a niobium based lead-free piezoelectric ceramic utilizing a conventional orthorhombic-tetragonal morphotropic phase boundary. But, that of this invention is different from the former, and a novel niobium based lead-free piezoelectric ceramic capable of forming a rhombohedral-tetragonal morphotropic phase boundary is provided. The principle composition range is shown in a diagonal portion in FIG. 1.

The perovskite solid solution composition according to this invention can be obtained by using desired various metal salts, for example, various forms including carbonates, oxalates, nitrates, hydroxides, oxides or the like, as raw materials, mixing these raw materials so as to have a prescribed composition and adjusting the mixture so as to finally have the composition represented by the foregoing general formula.

Also, with respect to a piezoelectric ceramic thereof, the foregoing composition is blended so as to have a desired composition, for example, mixed in a solvent such as ethanol by a ball mill or the like, and this mixture is dried and preferably calcined in the atmosphere. Though the calcination condition varies with the kind and composition of the raw material, in general, the temperature is from 850 to 1,000° C., and the time is from 2 to 10 hours. The thus obtained mixture after calcination was pulverized by a ball mill or the like, to which was then added a binder, and the resulting mixture was molded under a uniaxial pressure. The piezoelectric ceramic can be obtained by baking this molded article at a high temperature (for example, from 1,000 to 1,300° C.) by, for example, an electric furnace.

Also, in the foregoing composition formula of the perovskite structure ($ABO_3$), it is the most preferable that a ratio of the atoms constituting the A site to the atoms constituting the B site is stoichiometric as 1/1, namely m=0.

However, in a raw material weighing step, a mixing step, a granulation step, a sintering step or the like, there is a concern that the constitutional elements fluctuate by about several mol % from the stoichiometric ratio, for example, in the range of ±8 mol %. Also, there may be the case where the crystal structure is not a single perovskite structure, but an impurity phase of several mol % is generated due to the foregoing fluctuation in the composition ratio. However, in the piezoelectric solid solution composition of this invention, even in the case where the composition ratio is fluctuated by several mol % from the stoichiometric ratio, or in the case where impurities of several mol % are generated as described above, electrical characteristics such as a piezoelectric characteristic or the like do not largely change.

Also, in this invention, in addition to the piezoelectric solid solution composition represented by the foregoing general formula, a piezoelectric solid solution composition obtained by further adding at least one metal selected among Ba, Bi, Ca, Ce, Cr, Cu, Dy, Er, Eu, Ga, Gd, Ge, Ho, In, La, Lu, Mn, Nd, Pr, Sc, Si, Sm, Sn, Sr, Tb, Tm, V, W, Y and Yb or a compound containing the metal to the subject composition can be provided. Though the content of the metal is not particularly restricted, it is not more than 15% by weight, preferably not more than 10% by weight, and more preferably not more than 5% by weight of the whole of the composition.

As the foregoing compound containing the metal, desired various metal salts, for example, various forms including carbonates, oxalates, nitrates, hydroxides, oxides or the like can be used as the raw material.

This piezoelectric solid solution composition comprises the composition represented by the foregoing general formula as a main component and contains a prescribed amount of the foregoing additive metal as an auxiliary component. For that reason, when the composition represented by the foregoing general formula is sintered, the foregoing additive element works as a sintering aid, and the composition is easily densified. As a result, a piezoelectric ceramic having a high relative density of 95% or more and having an excellent mechanical strength is obtained through sintering at atmospheric pressure.

Also, when a part of the foregoing additive elements (for example, Mn) is added within a prescribed range to the composition represented by the foregoing general formula and then sintered, densification and growth of grains are promoted, whereby the piezoelectric characteristic or dielectric characteristic are more enhanced as compared with those in the piezoelectric ceramic in which the foregoing additive element is not added. For that reason, the piezoelectric solid solution composition of this invention can be utilized as a novel piezoelectric ceramic which is free from lead, has excellent characteristics and is environmentally friendly and as a piezoelectric, dielectric or pyroelectric element using the subject ceramic.

Such a piezoelectric solid solution composition is obtained by preferably calcining and pulverizing the composition represented by the foregoing general formula and then blending at least one metal selected among Ba, Bi, Ca, Ce, Cr, Cu, Dy, Er, Eu, Ga, Gd, Ge, Ho, In, La, Lu, Mn, Nd, Pr, Sc, Si, Sm, Sn, Sr, Tb, Tm, V, W, Y and Yb or a compound containing the metal so as to have a desired composition.

Also, with respect to a sintered material of this piezoelectric solid solution composition, this composition was mixed by a bail mill, to which was then preferably added a binder, and the mixture was molded under a uniaxial pressure. The sintered material can be obtained by baking this molded article at a high temperature, for example, from 1,000 to 1,300° C. by an electric furnace.

Also, In the foregoing piezoelectric ceramic obtained after baking, the foregoing metal element to be added as the additive may be incorporated into the A-site and/or B-site of the perovskite structure, or may be contained in a grain or grain boundary.

EXAMPLES

This invention is hereunder described in more detail with reference to the following Examples, but it should not be construed that this invention is limited to these Examples.

Examples 1 to 68

First of all, $K_2CO_3$, $Na_2CO_3$, $BaCO_3$, $SrCO_3$, $CaCO_3$, MgO, $Bi_2O_3$, $Li_2CO_3$, $Nb_2O_5$, $Ta_2O_5$, $TiO_2$, $ZrO_2$ and $HfO_2$ each having a chemically high purity were used as raw materials, blended so as to have a desired composition and mixed in ethanol by a ball mill. Subsequently, this mixture was dried and calcined in the atmosphere. Though the calcination condition varies with the kind and composition of the raw material, the temperature is from 850 to 1,000° C., and the time is from 2 to 10 hours. The thus obtained mixture after calcination was pulverized by a ball mill, to which was then added a binder, and the resulting mixture was molded under a uniaxial pressure. This molded article was baked at from 1,000 to 1,300° C. by an electric furnace, thereby obtaining a dense piezoelectric ceramic pellet.

With respect to the obtained dense piezoelectric ceramic, in order to evaluate the piezoelectric characteristic, after mirror polishing the both surfaces, a gold sputtered film was applied thereto, thereby forming an electrode. According to this, a dielectric element using the piezoelectric ceramic of this invention was obtained. Subsequently, a polarization treatment was carried out in a silicone oil at from 100 to 180° C. under a condition at from 20 to 50 kV/cm. According to this, a piezoelectric element using the piezoelectric ceramic of this invention was obtained.

With respect to the thus obtained piezoelectric element, after allowing it to stand for 24 hours, its electromechanical coupling coefficient $k_p$ and piezoelectric constant $d_{33}$ were measured. The electromechanical coupling coefficient $k_p$ was measured by a resonance-antiresonance method using an impedance analyzer. For the measurement of the piezoelectric constant $d_{33}$, a $d_{33}$ meter (YE2730A, manufactured by APC) was used. Also, for the measurement of a dielectric constant $\in_r$ of the thus obtained dielectric element, an impedance analyzer was used, and the measurement frequency was set up at 1 kHz. Also, a temperature of a peak of the dielectric constant was defined as a Curie temperature $T_c$. The crystal structure was determined from a powder X-ray diffraction pattern.

Chemical composition, Curie temperature $T_c$, dielectric constant $\in_r$, electromechanical coupling coefficient $k_p$, piezoelectric constant $d_{33}$ and crystal structure at room temperature (T: tetragonal, R: rhombohedral, R/T: neighboring to a morphotropic phase boundary) of each of the piezoelectric ceramics of the Examples of this invention are shown In Table 1. Though a relative density of the obtained ceramic is slightly different depending upon the composition and manufacturing method, it was 95% or more in almost all of the samples.

Comparative Example 1 referred to Example 41 in Table 1 of the foregoing Patent Document 8; and Comparative Example 2 referred to Example 42 of the same.

TABLE 1

General formula: $\{M_x(Na_yLi_zK_{1-y-z})_{1-x}\}_{t-m}\{(Ti_{1-u-v}Zr_uHf_v)_x(Nb_{1-w}Ta_w)_{1-x}\}O_3$

| Example No. & Comparative Example No. | M | x | y | z | u | v | w | m |
|---|---|---|---|---|---|---|---|---|
| 1 | $Ba_{0.3}(Bi_{0.5}K_{0.5})_{0.7}$ | 0.10 | 0.50 | 0 | 0.30 | 0 | 0 | 0 |
| 2 | $Ba_{0.4}(Bi_{0.5}K_{0.5})_{0.6}$ | 0.10 | 0.50 | 0 | 0.40 | 0 | 0 | 0 |
| 3 | $Ba_{0.5}(Bi_{0.5}K_{0.5})_{0.5}$ | 0.10 | 0.50 | 0 | 0.50 | 0 | 0 | 0 |
| 4 | $Ba_{0.6}(Bi_{0.5}K_{0.5})_{0.4}$ | 0.10 | 0.50 | 0 | 0.60 | 0 | 0 | 0 |
| 5 | $Ba_{0.7}(Bi_{0.5}K_{0.5})_{0.3}$ | 0.10 | 0.50 | 0 | 0.70 | 0 | 0 | 0 |
| 6 | $Ba_{0.8}(Bi_{0.5}K_{0.5})_{0.2}$ | 0.10 | 0.50 | 0 | 0.80 | 0 | 0 | 0 |
| 7 | $Ba_{0.9}(Bi_{0.5}K_{0.5})_{0.1}$ | 0.10 | 0.50 | 0 | 0.90 | 0 | 0 | 0 |
| 8 | $Ba_{0.5}(Bi_{0.5}K_{0.5})_{0.5}$ | 0.08 | 0.50 | 0 | 0.50 | 0 | 0 | 0 |
| 9 | $Ba_{0.625}(Bi_{0.5}K_{0.5})_{0.375}$ | 0.08 | 0.50 | 0 | 0.625 | 0 | 0 | 0 |
| 10 | $Ba_{0.75}(Bi_{0.5}K_{0.5})_{0.25}$ | 0.08 | 0.50 | 0 | 0.75 | 0 | 0 | 0 |
| 11 | $Ba_{0.875}(Bi_{0.5}K_{0.5})_{0.125}$ | 0.08 | 0.50 | 0 | 0.875 | 0 | 0 | 0 |
| 12 | $Ba_{0.5}(Bi_{0.5}Na_{0.5})_{0.5}$ | 0.08 | 0.50 | 0 | 0.50 | 0 | 0 | 0 |
| 13 | $Ba_{0.625}(Bi_{0.5}Na_{0.5})_{0.375}$ | 0.08 | 0.50 | 0 | 0.625 | 0 | 0 | 0 |
| 14 | $Ba_{0.75}(Bi_{0.5}Na_{0.5})_{0.25}$ | 0.08 | 0.50 | 0 | 0.75 | 0 | 0 | 0 |
| 15 | $Ba_{0.875}(Bi_{0.5}Na_{0.5})_{0.125}$ | 0.08 | 0.50 | 0 | 0.875 | 0 | 0 | 0 |
| 16 | $Ba_{0.5}(Bi_{0.5}Li_{0.5})_{0.5}$ | 0.08 | 0.50 | 0 | 0.50 | 0 | 0 | 0 |
| 17 | $Ba_{0.625}(Bi_{0.5}Li_{0.5})_{0.375}$ | 0.08 | 0.50 | 0 | 0.625 | 0 | 0 | 0 |
| 18 | $Ba_{0.75}(Bi_{0.5}Li_{0.5})_{0.25}$ | 0.08 | 0.50 | 0 | 0.75 | 0 | 0 | 0 |
| 19 | $Ba_{0.875}(Bi_{0.5}Li_{0.5})_{0.125}$ | 0.08 | 0.50 | 0 | 0.875 | 0 | 0 | 0 |
| 20 | $Sr_{0.5}(Bi_{0.5}K_{0.5})_{0.5}$ | 0.08 | 0.50 | 0 | 0.50 | 0 | 0 | 0 |
| 21 | $Sr_{0.625}(Bi_{0.5}K_{0.5})_{0.375}$ | 0.08 | 0.50 | 0 | 0.625 | 0 | 0 | 0 |
| 22 | $Sr_{0.75}(Bi_{0.5}K_{0.5})_{0.25}$ | 0.08 | 0.50 | 0 | 0.75 | 0 | 0 | 0 |
| 23 | $Sr_{0.875}(Bi_{0.5}K_{0.5})_{0.125}$ | 0.08 | 0.50 | 0 | 0.875 | 0 | 0 | 0 |
| 24 | $Sr_{0.5}(Bi_{0.5}Na_{0.5})_{0.5}$ | 0.08 | 0.50 | 0 | 0.50 | 0 | 0 | 0 |
| 25 | $Sr_{0.625}(Bi_{0.5}Na_{0.5})_{0.375}$ | 0.08 | 0.50 | 0 | 0.625 | 0 | 0 | 0 |
| 26 | $Sr_{0.75}(Bi_{0.5}Na_{0.5})_{0.25}$ | 0.08 | 0.50 | 0 | 0.75 | 0 | 0 | 0 |
| 27 | $Sr_{0.875}(Bi_{0.5}Na_{0.5})_{0.125}$ | 0.08 | 0.50 | 0 | 0.875 | 0 | 0 | 0 |
| 28 | $Sr_{0.5}(Bi_{0.5}Li_{0.5})_{0.5}$ | 0.08 | 0.50 | 0 | 0.50 | 0 | 0 | 0 |
| 29 | $Sr_{0.625}(Bi_{0.5}Li_{0.5})_{0.375}$ | 0.08 | 0.50 | 0 | 0.625 | 0 | 0 | 0 |
| 30 | $Sr_{0.75}(Bi_{0.5}Li_{0.5})_{0.25}$ | 0.08 | 0.50 | 0 | 0.75 | 0 | 0 | 0 |
| 31 | $Sr_{0.875}(Bi_{0.5}Li_{0.5})_{0.125}$ | 0.08 | 0.50 | 0 | 0.875 | 0 | 0 | 0 |
| 32 | $Ca_{0.5}(Bi_{0.5}K_{0.5})_{0.5}$ | 0.08 | 0.50 | 0 | 0.50 | 0 | 0 | 0 |
| 33 | $Ca_{0.625}(Bi_{0.5}K_{0.5})_{0.375}$ | 0.08 | 0.50 | 0 | 0.625 | 0 | 0 | 0 |

TABLE 1-continued

General formula: $\{M_x(Na_yLi_zK_{1-y-z})_{1-x}\}_{t-m}\{(Ti_{1-u-v}Zr_uHf_v)_x(Nb_{1-w}Ta_w)_{1-x}\}O_3$

| No. | Composition | | | | | | | |
|---|---|---|---|---|---|---|---|---|
| 34 | $Ca_{0.75}(Bi_{0.5}K_{0.5})_{0.25}$ | 0.08 | 0.50 | 0 | 0.75 | 0 | 0 | 0 |
| 35 | $Ca_{0.875}(Bi_{0.5}K_{0.5})_{0.125}$ | 0.08 | 0.50 | 0 | 0.875 | 0 | 0 | 0 |
| 36 | $Ca_{0.5}(Bi_{0.5}Na_{0.5})_{0.5}$ | 0.08 | 0.50 | 0 | 0.50 | 0 | 0 | 0 |
| 37 | $Ca_{0.625}(Bi_{0.5}Na_{0.5})_{0.375}$ | 0.08 | 0.50 | 0 | 0.625 | 0 | 0 | 0 |
| 38 | $Ca_{0.75}(Bi_{0.5}Na_{0.5})_{0.25}$ | 0.08 | 0.50 | 0 | 0.75 | 0 | 0 | 0 |
| 39 | $Ca_{0.876}(Bi_{0.5}Na_{0.5})_{0.125}$ | 0.08 | 0.50 | 0 | 0.875 | 0 | 0 | 0 |
| 40 | $Ca_{0.5}(Bi_{0.5}Li_{0.5})_{0.5}$ | 0.08 | 0.50 | 0 | 0.50 | 0 | 0 | 0 |
| 41 | $Ca_{0.625}(Bi_{0.5}Li_{0.5})_{0.375}$ | 0.08 | 0.50 | 0 | 0.625 | 0 | 0 | 0 |
| 42 | $Ca_{0.75}(Bi_{0.5}Li_{0.5})_{0.25}$ | 0.08 | 0.50 | 0 | 0.75 | 0 | 0 | 0 |
| 43 | $Ca_{0.875}(Bi_{0.5}Li_{0.5})_{0.125}$ | 0.08 | 0.50 | 0 | 0.875 | 0 | 0 | 0 |
| 44 | $Ba_{0.25}(Bi_{0.5}K_{0.5})_{0.75}$ | 0.12 | 0.49 | 0.02 | 0.25 | 0 | 0 | 0 |
| 45 | $Ba_{0.417}(Bi_{0.5}K_{0.5})_{0.583}$ | 0.12 | 0.49 | 0.02 | 0.417 | 0 | 0 | 0 |
| 46 | $Ba_{0.583}(Bi_{0.5}K_{0.5})_{0.417}$ | 0.12 | 0.49 | 0.02 | 0.583 | 0 | 0 | 0 |
| 47 | $Ba_{0.75}(Bi_{0.5}K_{0.5})_{0.25}$ | 0.12 | 0.49 | 0.02 | 0.75 | 0 | 0 | 0 |
| 48 | $Ba_{0.417}(Bi_{0.5}K_{0.5})_{0.583}$ | 0.12 | 0.49 | 0.04 | 0.417 | 0 | 0 | 0 |
| 49 | $Ba_{0.583}(Bi_{0.5}K_{0.5})_{0.417}$ | 0.12 | 0.49 | 0.04 | 0.583 | 0 | 0 | 0 |
| 50 | $Ba_{0.50}(Bi_{0.6}K_{0.5})_{0.50}$ | 0.08 | 0.50 | 0 | 0.75 | 0 | 0 | 0 |
| 51 | $Ba_{0.875}(Bi_{0.6}K_{0.5})_{0.825}$ | 0.08 | 0.50 | 0 | 0.75 | 0 | 0 | 0 |
| 52 | $Ba_{0.25}(Bi_{0.6}K_{0.5})_{0.76}$ | 0.08 | 0.50 | 0 | 0.75 | 0 | 0 | 0 |
| 53 | $Ba_{0.625}Mg_{0.125}(Bi_{0.5}K_{0.5})_{0.25}$ | 0.08 | 0.50 | 0 | 0.75 | 0 | 0 | 0 |
| 54 | $Ba_{0.50}Mg_{0.125}(Bi_{0.5}K_{0.5})_{0.375}$ | 0.08 | 0.50 | 0 | 0.625 | 0 | 0.05 | 0 |
| 55 | $Ba_{0.625}Mg_{0.125}(Bi_{0.5}K_{0.5})_{0.25}$ | 0.08 | 0.50 | 0 | 0.75 | 0 | 0.05 | 0 |
| 56 | $Ba_{0.75}(Bi_{0.5}K_{0.5})_{0.25}$ | 0.08 | 0.50 | 0 | 0.375 | 0.375 | 0 | 0 |
| 57 | $Ba_{0.75}(Bi_{0.5}K_{0.5})_{0.25}$ | 0.08 | 0.50 | 0 | 0 | 0.75 | 0 | 0 |
| 58 | $Ba_{0.75}(Bi_{0.5}K_{0.5})_{0.25}$ | 0.08 | 0.50 | 0 | 0.75 | 0 | 0.02 | 0 |
| 59 | $Ba_{0.75}(Bi_{0.5}K_{0.5})_{0.25}$ | 0.08 | 0.50 | 0 | 0.75 | 0 | 0.05 | 0 |
| 60 | $Ba_{0.75}(Bi_{0.5}K_{0.5})_{0.25}$ | 0.08 | 0.50 | 0 | 0.75 | 0 | 0.07 | 0 |
| 61 | $Ba_{0.75}(Bi_{0.5}K_{0.5})_{0.25}$ | 0.08 | 0.50 | 0 | 0.75 | 0 | 0.10 | 0 |
| 62 | $Ba_{0.5}(Bi_{0.5}K_{0.5})_{0.5}$ | 0.08 | 0.60 | 0 | 0.75 | 0 | 0 | 0 |
| 63 | $Ba_{0.5}(Bi_{0.5}K_{0.5})_{0.5}$ | 0.08 | 0.56 | 0 | 0.75 | 0 | 0 | 0 |
| 64 | $Ba_{0.5}(Bi_{0.5}K_{0.5})_{0.5}$ | 0.08 | 0.52 | 0 | 0.75 | 0 | 0 | 0 |
| 65 | $Ba_{0.5}(Bi_{0.5}K_{0.5})_{0.5}$ | 0.08 | 0.48 | 0 | 0.75 | 0 | 0 | 0 |
| 66 | $Ba_{0.5}(Bi_{0.5}K_{0.5})_{0.5}$ | 0.08 | 0.44 | 0 | 0.75 | 0 | 0 | 0 |
| 67 | $Ba_{0.5}(Bi_{0.5}K_{0.5})_{0.5}$ | 0.08 | 0.40 | 0 | 0.75 | 0 | 0 | 0 |
| 68 | $Ba_{0.75}(Bi_{0.5}K_{0.5})_{0.25}$ | 0.08 | 0.5 | 0 | 0.75 | 0 | 0 | 0.005 |
| Comparative Example 1 | $Hi_{0.5}Na_{0.5}$ | 0.05 | 0.4 | 0 | 1.0 | 0 | 0 | 0 |
| Comparative Example 2 | $Bi_{0.5}Na_{0.5}$ | 0.09 | 0.4 | 0 | 1.0 | 0 | 0 | 0 |

| Example No. & Comparative Example No. | Dielectric constant $\in_r$ | Electro-mechanical coupling coefficient $k_p$ (%) | Piezoelectric constant $d_{33}$ (pC/N) | Curie temperature $T_c$ (° C.) | Crystal structure, R: Rhombohedral, T: Tetragonal, R/T: Neighboring to a morphotropic phase boundary |
|---|---|---|---|---|---|
| 1 | 1618 | 38.6 | 110 | 236 | T |
| 2 | 1740 | 34.9 | 121 | 224 | T |
| 3 | 1910 | 30.1 | 160 | 205 | T |
| 4 | 1910 | 35.6 | 215 | 196 | R/T |
| 5 | 2769 | 43.3 | 310 | 189 | R/T |
| 6 | 3016 | 32.4 | 250 | 179 | R |
| 7 | 2740 | 23.0 | 140 | 179 | R |
| 8 | 2105 | 33.0 | 145 | 258 | T |
| 9 | 2227 | 36.2 | 207 | 241 | R/T |
| 10 | 1998 | 45.2 | 315 | 234 | R/T |
| 11 | 1715 | 37.3 | 205 | 234 | R |
| 12 | 1574 | 41.5 | 240 | 250 | T |
| 13 | 1918 | 52.6 | 365 | 243 | R/T |
| 14 | 2070 | 50.6 | 320 | 235 | R/T |
| 15 | 1373 | 35.3 | 195 | 224 | R |
| 16 | 1527 | 37.5 | 182 | 272 | T |
| 17 | 1637 | 49.6 | 290 | 256 | R/T |
| 18 | 1998 | 54.0 | 420 | 243 | R/T |
| 19 | 1830 | 41.4 | 225 | 234 | R |
| 20 | 1700 | 23.8 | 135 | 240 | T |
| 21 | 2120 | 52.0 | 370 | 235 | R/T |
| 22 | 2060 | 53.5 | 315 | 224 | R/T |
| 23 | 1823 | 18.5 | 85 | 214 | R |
| 24 | 1460 | 26.9 | 160 | 241 | T |
| 25 | 2028 | 53.2 | 380 | 237 | R/T |
| 26 | 2019 | 50.5 | 320 | 224 | R/T |
| 27 | 1930 | 17.2 | 70 | 216 | R |
| 28 | 1210 | 25.3 | 115 | 261 | T |
| 29 | 1620 | 24.6 | 125 | 245 | R/T |
| 30 | 1841 | 49.0 | 335 | 235 | R//T |
| 31 | 1735 | 24.6 | 130 | 222 | R |

TABLE 1-continued

General formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$

| | | | | | |
|---|---|---|---|---|---|
| 32 | 1523 | 44.0 | 250 | 260 | T |
| 33 | 1818 | 52.5 | 365 | 252 | R/T |
| 34 | 1855 | 50.2 | 300 | 244 | R/T |
| 35 | 1710 | 22.3 | 105 | 247 | R |
| 36 | 1530 | 33.9 | 170 | 258 | T |
| 37 | 1846 | 49.2 | 335 | 254 | R/T |
| 38 | 1886 | 44.4 | 265 | 249 | R/T |
| 39 | 1708 | 17.2 | 80 | 210 | R |
| 40 | 1416 | 18.5 | 60 | 277 | T |
| 41 | 1545 | 49.5 | 285 | 266 | R/T |
| 42 | 1876 | 50.2 | 355 | 254 | R/T |
| 43 | 1718 | 21.0 | 100 | 222 | R |
| 44 | 1160 | 22.1 | 62 | 195 | T |
| 45 | 1840 | 34.4 | 155 | 181 | R/T |
| 46 | 1743 | 36.5 | 195 | 160 | R/T |
| 47 | 3163 | 22.4 | 145 | 140 | R |
| 48 | 1030 | 20.3 | 60 | 199 | — |
| 49 | 1638 | 27.4 | 130 | 177 | — |
| 50 | 2505 | 52.0 | 376 | 237 | — |
| 51 | 1883 | 45.2 | 300 | 251 | — |
| 52 | 1912 | 28.0 | 150 | 260 | — |
| 53 | 1480 | 40.2 | 210 | 256 | — |
| 54 | 2170 | 40.4 | 250 | 232 | — |
| 55 | 1884 | 35.4 | 200 | 226 | — |
| 56 | 1972 | 47.6 | 295 | 225 | — |
| 57 | 2070 | 49.2 | 295 | 218 | — |
| 58 | 2200 | 50.6 | 350 | 221 | — |
| 59 | 2385 | 47.2 | 355 | 203 | — |
| 60 | 2552 | 46.2 | 345 | 192 | — |
| 61 | 2612 | 39.5 | 295 | 174 | — |
| 62 | 1990 | 33.9 | 210 | 250 | — |
| 63 | 1921 | 36.4 | 220 | 250 | — |
| 64 | 1995 | 46.5 | 325 | 248 | — |
| 65 | 2072 | 44.7 | 300 | 247 | — |
| 66 | 2264 | 41.2 | 290 | 237 | — |
| 67 | 2317 | 48.9 | 355 | 239 | — |
| 68 | 1850 | 44.0 | 245 | 242 | — |
| Comparative Example 1 | 1150 | 28.5 | — | 295 | — |
| Comparative Example 2 | 1315 | 27.0 | — | 260 | — |

[Consideration]

Examples 1 to 7 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}K_{0.5})$ and Ba are combined as M, and the value of u is changed while fixing at x=0.10, y=0.50, z=v=w=0 and m=0. These piezoelectric ceramics display a high dielectric constant $\in_r$ of 1,600 or more, and they were more excellent than those of Comparative Examples 1 to 2. Also, the piezoelectric ceramic of Example 5 having a composition neighboring to a rhombohedral-tetragonal morphotropic phase boundary displays a dielectric constant of 2,700 or more, a high electromechanical coupling coefficient $k_p$ of 40% or more and a piezoelectric constant $d_{33}$ of 300 pC/N or more and is especially excellent.

Examples 8 to 11 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the value of u is changed while fixing at x=0.08, y=0.50, z=v=w=0 and m=0. These piezoelectric ceramics display a high dielectric constant $\in_r$ of 1,700 or more and a high electromechanical coupling coefficient $k_p$ of 30% or more, and they were more excellent than those of Comparative Examples 1 to 2. In particular, the piezoelectric ceramic of Example 10 having a composition neighboring to a rhombohedral-tetragonal morphotropic phase boundary has a high Curie temperature $T_c$, a high electromechanical coupling coefficient $k_p$ and a high piezoelectric constant $d_{33}$ at the same time and is especially excellent.

Examples 12 to 15 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}Na_{0.5})$ and Ba are combined as M, and the value of u is changed while fixing at x=0.08, y=0.50, z=v=w=0 and m=0. These piezoelectric ceramics display a Curie temperature of 220° C. or higher, a high dielectric constant $\in_r$ of 1,300 or more and a high electromechanical coupling coefficient $k_p$ of 30% or more, and they were more excellent than those of Comparative Examples 1 to 2. In particular, the piezoelectric ceramics of Examples 13 and 14 each having a composition neighboring to a rhombohedral-tetragonal morphotropic phase boundary have a high Curie temperature $T_c$, a high electromechanical coupling coefficient $k_p$ and a high piezoelectric constant $d_{33}$ at the same time and are especially excellent.

Examples 16 to 19 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}Li_{0.5})$ and Ba are combined as M, and the value of u is changed while fixing at x=0.08, y=0.50, z=v=w=0 and m=0. These piezoelectric ceramics display a Curie temperature of 230° C. or higher, a high dielectric constant $\in_r$ of 1,500 or more and a high electromechanical coupling coefficient $k_p$ of 35% or more, and they were more excellent than those of Comparative Examples 1 to 2. In particular, the piezoelectric ceramic of Example 18 having a composition neighboring to a rhombohedral-tetragonal morphotropic phase boundary have a high Curie temperature $T_c$ as 243° C., a high electromechanical coupling coefficient $k_p$, as 54.0% and a high piezoelectric constant $d_{33}$ as 420 pC/N at the same time and is especially excellent.

Examples 20 to 23 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}K_{0.5})$ and Sr are combined as M, and the value of u is changed while fixing at x=0.08, y=0.50, z=v=w=0 and m=0. These piezoelectric ceramics display a Curie temperature of 210° C. or higher and a high dielectric constant $\in_r$ of 1,700 or more, and their dielectric constant was more excellent than that in Comparative Examples 1 to 2. In particular, the piezoelectric ceramics of Examples 21 and 22 each having a composition neighboring to a rhombohedral-tetragonal morphotropic phase boundary have a high Curie temperature $T_c$ as 220° C. or higher, a high electromechanical coupling coefficient $k_p$ as 50% or more and a high piezoelectric constant $d_{33}$ as 300 pC/N or more at the same time and are especially excellent.

Examples 24 to 27 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}Na_{0.5})$ and Sr are combined as M, and the value of u is changed while fixing at x=0.08, y=0.50, z=v=w=0 and m=0. These piezoelectric ceramics display a Curie temperature of 210° C. or higher and a high dielectric constant $\in_r$ of 1,400 or more, and their dielectric constant was more excellent than that of Comparative Examples 1 to 2. In particular, the piezoelectric ceramics of Examples 25 and 26 each having a composition neighboring to a rhombohedral-tetragonal morphotropic phase boundary have a high Curie temperature $T_c$ as 220° C. or higher, a high electromechanical coupling coefficient $k_p$ as 50% or more and a high piezoelectric constant $d_{33}$ as 320 pC/N or more at the same time and are especially excellent.

Examples 28 to 31 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}Li_{0.5})$ and Sr are combined as M, and the value of u is changed while fixing at x=0.08, y=0.50, z=v=w=0 and m=0. These piezoelectric ceramics display a Curie temperature of 220° C. or higher, a high dielectric constant $\in_r$ of 1,200 or more and a high electromechanical coupling coefficient $k_p$ of 24% or more. In particular, the piezoelectric ceramic of Example 30 having a composition neighboring to a rhombohedral-tetragonal morphotropic phase boundary has a high Curie temperature $T_c$ as 235° C., a high electromechanical coupling coefficient $k_p$ as 49.0% and a high piezoelectric constant $d_{33}$ as 335 pC/N at the same time and is especially excellent.

Examples 32 to 35 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}K_{0.5})$ and Ca are combined as M, and the value of u is changed while fixing at x=0.08, y=0.50, z=v=w=0 and m=0. These piezoelectric ceramics display a Curie temperature of 240° C. or higher, a high dielectric constant $\in_r$ of 1,500 or more and a high electromechanical coupling coefficient $k_p$ of 22% or more. In particular, the piezoelectric ceramics of Examples 33 and 34 each having a composition neighboring to a rhombohedral-tetragonal morphotropic phase boundary have a high Curie temperature $T_c$ as 240° C. or higher, a high electromechanical coupling coefficient $k_p$ as 50% or more and a high piezoelectric constant $d_{33}$ as 300 pC/N or more at the same time, and especially, their performance is high and more excellent than that in Comparative Examples 1 to 2.

Examples 36 to 39 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}Na_{0.5})$ and Ca are combined as M, and the value of u is changed while fixing at x=0.08, y=0.50, z=v=w=0 and m=0. These piezoelectric ceramics display a Curie temperature of 210° C. or higher and a high dielectric constant $\in_r$ of 1,500 or more, and their dielectric constant was more excellent than that in Comparative Examples 1 to 2. In particular, the piezoelectric ceramics of Examples 37 and 38 each having a composition neighboring to a rhombohedral-tetragonal morphotropic phase boundary have a high Curie temperature $T_c$ as 245° C. or higher, a high electromechanical coupling coefficient $k_p$ as 44% or more and a high piezoelectric constant $d_{33}$ as 260 pC/N or more at the same time and are especially excellent.

Examples 40 to 43 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}Li_{0.5})$ and Ca are combined as M, and the value of u is changed while fixing at x=0.08, y=0.50, Z=v=w=0 and m=0. These piezoelectric ceramics display a Curie temperature of 220° C. or higher and a high dielectric constant $\in_r$ of 1,400 or more, and their dielectric constant was more excellent than that of Comparative Examples 1 to 2. In particular, the piezoelectric ceramic of Example 42 having a composition neighboring to a rhombohedral-tetragonal morphotropic phase boundary has a high Curie temperature $T_c$ as 254° C., a high electromechanical coupling coefficient $k_p$ as 50.2% and a high piezoelectric constant $d_{33}$ as 355 pC/N at the same time, and thus, it can be utilized as an actuator component.

As is clear from the foregoing Examples, in the piezoelectric solid solution composition according to this invention, which comprises, as a main component, a composition represented by the following general formula:

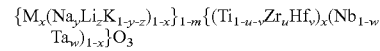
$\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$ (in the formula, M represents a combination of at least one member selected from the group consisting of $(Bi_{0.5}K_{0.5})$, $(Bi_{0.5}Na_{0.5})$ and $(Bi_{0.5}Li_{0.5})$ and at least one member selected from the group consisting of Ba, Sr, Ca and Mg; and x, y, z, u, v, w and m are in the following ranges: $0.06<x\leq0.3$, $0\leq y\leq1$, $0\leq z\leq0.3$, $0\leq(y+z)1$, $0<u\leq1$, $0\leq v\leq0.75$, $0\leq w\leq0.2$, $0<(u+v)\leq1$ and $-0.06\leq m\leq0.06$), in the case where the values of x, y, z, u, v, w and m fall within the foregoing ranges, even when M is a combination of $(Bi_{0.5}K_{0.5})$ and Ba, a combination of $(Bi_{0.5}Na_{0.5})$ and Ba, a combination of $(Bi_{0.5}Li_{0.5})$ and Ba, a combination of $(Bi_{0.5}K_{0.5})$ and Sr, a combination of $(Bi_{0.5}Na_{0.5})$ and Sr, a combination of $(Bi_{0.5}Li_{0.5})$ and Sr, a combination of $(Bi_{0.5}K_{0.5})$ and Ca, a combination of $(Bi_{0.5}Na_{0.5})$ and Ca, or a combination of $(Bi_{0.5}Li_{0.5})$ and Ca, it forms a rhombohedral-tetragonal morphotropic phase boundary. All of the piezoelectric ceramics having a composition neighboring to a rhombohedral-tetragonal morphotropic phase boundary are excellent in the characteristics. That is, in this invention, the foregoing combinations have equal effects. In Examples 44 to 68, effects are examined when a combination of $(Bi_{0.5}K_{0.5})$ and Ba as M is chosen as an example, and the values of x, y, z, u, v, w and m are changed. These effects are not limited to the combination of $(Bi_{0.5}K_{0.5})$ and Ba but are also valid for other combinations.

Examples 44 to 47 are concerned with a piezoelectric ceramic in the case wherein in the foregoing general formula:

$\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the value of u is changed while fixing at x=0.12, y=0.50, z=0.02, v=w=0 and m=0. These piezoelectric ceramics display a high dielectric constant $\in_r$ of 1,160 or more, and they were more excellent than that of Comparative Example 1. In particular, the piezoelectric ceramics of Examples 45 and 46 each having a composition neighboring to a rhombohedral-tetragonal morphotropic phase boundary have a high Curie temperature $T_c$, a high electromechanical coupling coefficient $k_p$ and a high piezoelectric constant $d_{33}$ at the same time, and thus, they can be utilized as an actuator component.

Examples 48 to 49 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the value of u is changed while fixing at x=0.12, y=0.50, z=0.04, v=w=0 and m=0. These piezoelectric ceramics display a high Curie temperature and a high dielectric constant $\in_r$ of 1,000 or more, and thus, they can be utilized as a dielectric ceramic. In particular, the piezoelectric ceramic of Example 49 has a high dielectric constant $\in_r$, a high electromechanical coupling coefficient $k_p$ and a high piezoelectric constant $d_{33}$ at the same time, and it was more excellent than that of Comparative Example 1.

Examples 50 to 52 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and a portion of $(Bi_{0.5}K_{0.5})$ and Ba is changed while fixing at x=0.08, y=0.50, u=0.06, z=v=w=0 and m=0. These piezoelectric ceramics display a Curie temperature of 235° C. or higher, a high dielectric constant $\in_r$ of 1,800 or more and a high electromechanical coupling coefficient $k_p$ of 28% or more, and they were more excellent than those of Comparative Examples 1 to 2. In particular, the piezoelectric ceramic of Example 50 has a high Curie temperature $T_c$ as 237° C., a high electromechanical coupling coefficient $k_p$ as 52.0% and a high piezoelectric constant $d_{33}$ as 376 pC/N at the same time and is especially excellent.

Examples 53 to 55 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ Ba and Mg are combined as M, and the values of u and w are changed while fixing at x=0.08, y=0.50, z=v=0 and m=0. These piezoelectric ceramics display a Curie temperature of 220° C. or higher, a high dielectric constant $\in_r$ of 1,450 or more and a high electromechanical coupling coefficient $k_P$ of 35% or more, and they were more excellent than those of Comparative Examples 1 to 2. In particular, the piezoelectric ceramic of Example 54 has a high Curie temperature $T_c$, a high dielectric constant $\in_r$, a high electromechanical coupling coefficient $k_p$ and a high piezoelectric constant $d_{33}$ at the same time, and thus, it can be utilized as an actuator component.

Examples 56 to 57 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the values of u and v are changed while fixing at x=0.08, y=0.50, z=w=0 and m=0. These piezoelectric ceramics display a Curie temperature of 210° C. or higher, a high dielectric constant $\in_r$ of 1,900 or more, a high electromechanical coupling coefficient $k_p$ of 45% or more and a high piezoelectric constant $d_{33}$ as 295 pC/N, and they were more excellent than those of Comparative Examples 1 to 2. These piezoelectric ceramics have a high Curie temperature $T_c$, a high electromechanical coupling coefficient $k_p$ and a high piezoelectric constant $d_{33}$ at the same time, and thus, they can be utilized as an actuator component.

Examples 58 to 61 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the value of w is changed while fixing at x=0.08, y=0.50, u=0.06, z=v=0 and m=0. These piezoelectric ceramics display a high dielectric constant $\in_r$ of 2,000 or more and a high electromechanical coupling coefficient $k_p$ of 39% or more, and they were more excellent than those of Comparative Examples 1 to 2. In particular, the piezoelectric ceramics of Examples 58 and 59 have a high Curie temperature $T_c$ as 200° C. or higher, a high electromechanical coupling coefficient $k_p$ as 47% or more and a high piezoelectric constant $d_{33}$ as 350 pC/N or more at the same time, and thus, they can be utilized as an actuator component.

Examples 62 to 67 are concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}$ $O_3$, $(Bi_{0.5}K_{0.5})$ and Ba are combined as M, and the value of y is changed while fixing at x=0.08, u=0.06, z=v=w=0 and m=0. These piezoelectric ceramics display a Curie temperature of 230° C. or higher, a high dielectric constant $\in_r$ of 1,900 or more and a high electromechanical coupling coefficient $k_p$ of 30% or more, and they were more excellent than those of Comparative Examples 1 to 2. In particular, the piezoelectric ceramic of Example 67 has a high. Curie temperature $T_c$ of 239° C., a high electromechanical coupling coefficient $k_p$ of 48.9% and a high piezoelectric constant $d_{33}$ of 355 pC/N at the same time, and is especially excellent.

Example 68 is concerned with a piezoelectric ceramic in the case wherein in the foregoing general formula: $\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3$, $(Bi_{0.5}K_{0.5})$ and Ba are combined as M, and m is fixed at 0.005 while fixing at x=0.08, y=0.50, u=0.06, z=v=w=0. The piezoelectric ceramic of this Example displays a Curie temperature of 242° C., a dielectric constant $\in_r$ of 1,850, an electromechanical coupling coefficient $k_p$ of 44.0% and a piezoelectric constant $d_{33}$ of 240 pC/N, and it was more excellent than those of Comparative Examples 1 to 2. Also, these characteristics are not largely changed as compared with those of Example 10.

According to the past studies, piezoelectric, dielectric or pyroelectric properties, mechanical characteristics and the like of piezoelectric ceramics can be adjusted by incorporating an additive and can be made corresponding to wide-ranging applications. Examples 69 to 97 and Examples 98 to 102 are those in which an effect of an additive is examined while referring to the case where M is a combination of $(Bi_{0.5}K_{0.5})$ and Ba or a combination of $(Bi_{0.5}K_{0.5})$ and Ca as an example. This effect is not limited to the cases of a combination of $(Bi_{0.5}K_{0.5})$ and Ba and a combination of $(Bi_{0.5}K_{0.5})$ and Ca but is also widely valid for other combinations or compositions.

Examples 69 to 97

According to Examples 69 to 97, in Example 10 (dielectric constant $\in_r$: 1,998, electromechanical coupling coefficient $k_p$: 45.2%, piezoelectric constant $d_{33}$: 315 pC/N, Curie temperature $T_c$: 234° C., mechanical quality factor $Q_m$: 51), at least one metal selected among Ba, Bi, Ca, Ce, Dy, Er, Eu, Ga, Gd, Ge, Ho, In, La, Lu, Mn, Nd, Pr, Si, Sm, Sn, Sr, Tb, Tm, V, W, Y and Yb or a compound containing the metal was added to the mixture after calcination. The mixture was pulverized by a ball mill, to which was then added a binder, and the resulting mixture was molded under a uniaxial pressure. This molded article was baked at from 1,000 to 1,300° C. by an electric furnace, thereby obtaining a dense piezoelectric ceramic pellet.

With respect to the obtained dense piezoelectric ceramic, in order to evaluate the piezoelectric characteristic, after mirror polishing the both surfaces, a gold sputtered film was applied thereto, thereby forming an electrode. According to this, a dielectric element using the piezoelectric ceramic of this invention was obtained. Subsequently, a polarization treatment was carried out in a silicone oil at from 100 to 180° C. under a condition at from 20 to 50 kV/cm. According to this, a piezoelectric element using the piezoelectric ceramic of this invention was obtained.

With respect to the thus obtained piezoelectric element, after allowing it to stand for 24 hours, its electromechanical coupling coefficient $k_p$, mechanical quality factor $Q_m$ and piezoelectric constant $d_{33}$ were measured. The electromechanical coupling coefficient $k_p$ and mechanical quality factor $Q_m$ were measured by a resonance-antiresonance method using an impedance analyzer. For the measurement of the piezoelectric constant $d_{33}$, a $d_{33}$ meter (YE2730A, manufactured by APC) was used. Also, for the measurement of a dielectric constant $\in_1$ of the thus obtained dielectric element, an impedance analyzer was used, and the measurement frequency was set up at 1 kHz. Also, a temperature of a peak of the dielectric constant was defined as a Curie temperature $T_c$.

Chemical composition, dielectric constant $\in_r$, electromechanical coupling coefficient $k_p$, piezoelectric constant $d_{33}$, mechanical quality factor $Q_m$ and Curie temperature $T_c$ of each of the piezoelectric ceramics of Examples 69 to 97 of this invention are shown in Table 2. Though a relative density of the obtained ceramic is slightly different depending upon the composition and manufacturing method, it was 95% or more in almost all of the samples.

TABLE 2

| Example No. | Additive component | Addition amount (% by weight) | Dielectric constant $\in_r$ | Electromechanical coupling coefficient $k_p$ (%) | Piezoelectric constant $d_{33}$ (pC/N) | Mechanical quality factor $Q_m$ | Curie temperature $T_c$ (° C.) |
|---|---|---|---|---|---|---|---|
| 69 | $MnO_2$ | 0.10 | 2050 | 51.7 | 360 | 67 | 235 |
| 70 | $MnO_2$ | 0.25 | 2160 | 55.2 | 410 | 70 | 229 |
| 71 | $MnO_2$ | 0.50 | 2080 | 54.0 | 385 | 60 | 219 |
| 72 | $Y_2O_3$ | 0.25 | 2368 | 52.9 | 430 | 43 | 213 |
| 73 | $La_2O_3$ | 0.25 | 2114 | 48.6 | 345 | 53 | 218 |
| 74 | $Ce_2O_3$ | 0.25 | 2420 | 56.6 | 385 | 60 | 214 |
| 75 | $Pr_2O_3$ | 0.25 | 2215 | 47.5 | 330 | 54 | 218 |
| 76 | $Nd_2O_3$ | 0.25 | 2222 | 45.0 | 315 | 54 | 217 |
| 77 | $Sm_2O_3$ | 0.25 | 2376 | 46.4 | 325 | 52 | 218 |
| 78 | $Eu_2O_3$ | 0.25 | 2238 | 50.9 | 360 | 51 | 220 |
| 79 | $Gd_2O_3$ | 0.25 | 2124 | 44.1 | 285 | 58 | 223 |
| 80 | $Tb_2O_3$ | 0.25 | 2006 | 49.0 | 320 | 11 | 224 |
| 81 | $Dy_2O_3$ | 0.25 | 2190 | 51.7 | 350 | 52 | 223 |
| 82 | $Ho_2O_3$ | 0.25 | 2148 | 37.8 | 240 | 74 | 226 |
| 83 | $Er_2O_3$ | 0.25 | 2210 | 49.9 | 360 | 46 | 225 |
| 84 | $Tm_2O_3$ | 0.25 | 1841 | 43.2 | 305 | 56 | 229 |
| 85 | $Yb_2O_3$ | 0.25 | 2050 | 46.0 | 295 | 63 | 231 |
| 86 | $Lu_2O_3$ | 0.25 | 2168 | 44.6 | 300 | 63 | 232 |
| 87 | $V_2O_5$ | 0.25 | 1869 | 42.3 | 250 | 69 | 240 |
| 88 | $WO_3$ | 0.25 | 1900 | 41.6 | 250 | 66 | 239 |
| 89 | $Bi_2O_3$ | 0.25 | 2138 | 50.8 | 320 | 62 | 224 |
| 90 | $BaCO_3$ | 0.25 | 2041 | 48.2 | 290 | 60 | 229 |
| 91 | $SrCO_3$ | 0.25 | 2056 | 44.7 | 310 | 61 | 225 |
| 92 | $CaCO_3$ | 0.25 | 2216 | 45.5 | 315 | 51 | 224 |
| 93 | $Ge_2O_3$ | 0.25 | 1830 | 36.8 | 210 | 83 | 237 |
| 94 | $Ga_2O_3$ | 0.25 | 2085 | 55.5 | 355 | 18 | 229 |
| 95 | $SiO_2$ | 0.25 | 1830 | 52.6 | 313 | 61 | 232 |
| 96 | SnO | 0.25 | 1810 | 54.3 | 330 | 51 | 228 |
| 97 | $In_2O_3$ | 0.25 | 1935 | 54.3 | 320 | 64 | 232 |

[Consideration]

Examples 69 to 71 are concerned with a piezoelectric ceramic obtained by adding $MnO_2$ in an amount of 0.10% by weight, 0.25% by weight and 0.50% by weight, respectively to that in Example 10. As compared with Example 10 before the addition, in all of these three Examples, the dielectric constant $\in_r$, electromechanical coupling coefficient $k_p$, piezoelectric constant $d_{33}$ and mechanical quality factor $Q_m$ were enhanced. Example 70 in which 0.25% by weight of $MnO_2$ is added displays a dielectric constant $\in_r$ of 2,100 or more, an electrochemical coupling coefficient $k_p$ of 55% or more and a piezoelectric constant $d_{33}$ of 400 pC/N or more and is especially excellent.

In Example 70 in which 0.25% by weight of $MnO_2$ is added, the most excellent characteristics are obtained. Thus, the addition amount of at least one metal selected among Ba, Bi, Ca, Ce, Dy, Er, Eu, Ga, Gd, Ge, Ho, In, La, Lu, Nd, Pr, Si, Sm, Sn, Sr, Tb, Tm, V, W, Y and Yb or a compound containing the metal, which is used as the additive, was fixed at 0.25% by weight.

It is noted that the piezoelectric ceramics of Examples 72 to 75, Examples 77 to 78, Examples 80 to 81, Example 83, Example 89 and Example 94 have higher dielectric constant $\in_r$, electromechanical coupling coefficient $k_p$ and piezoelectric constant $d_{33}$ at the same time as compared with that of Example 10. In particular, the piezoelectric ceramic of Example 72 in which 0.25% by weight of $Y_2O_3$ is added displays a high dielectric constant $\in_r$ of 2,300 or more, a high electromechanical coupling coefficient $K_p$ of 52.9% and a piezoelectric constant $d_{33}$ of 430 pC/N, and thus, it is especially excellent.

Also, it is noted that the piezoelectric ceramics of Examples 96 to 97 have higher electromechanical coupling coefficient $k_p$ and piezoelectric constant $d_{33}$ at the same time as compared with that of Example 10.

Also, it is noted that the piezoelectric ceramics of Example 85, Example 90 and Example 92 have higher dielectric constant $\in_r$ and electromechanical coupling coefficient $k_p$ at the same time as compared with that of Example 10.

Also, it is noted that the piezoelectric ceramic of Example 95 has a higher electromechanical coupling coefficient $k_p$ as compared with that of Example 10.

Also, it is noted that the piezoelectric ceramics of Example 76, Example 79, Example 82, Example 86 and Example 91 have a higher dielectric constant $\in_r$ and a higher mechanical quality factor $Q_m$ as compared with that of Example 10.

Also, it is noted that the piezoelectric ceramics of Example 87 and Example 88 have a dielectric constant $\in_r$, an electromechanical coupling coefficient $k_p$ and a piezoelectric constant $d_{33}$ comparable to that of Example 10 and simultaneously have higher mechanical quality factor $Q_m$ and Curie temperature $T_c$ as compared with that of Example 10.

Also, it is noted that the piezoelectric ceramics of Example 84 and Example 93 have a dielectric constant $\in_r$, an electromechanical coupling coefficient $k_p$, a piezoelectric constant $d_{33}$ and Curie temperature $T_c$ comparable to that of Example 10 and simultaneously have a higher mechanical quality factor $Q_m$ as compared with that of Example 10.

Examples 98 to 102

According to Examples 98 to 102, in Example 32 (dielectric constant $\in_r$: 1,523, electromechanical coupling coefficient $k_p$: 44.0%, piezoelectric constant $d_{33}$: 250 pC/N, Curie temperature $T_c$: 260° C., mechanical quality factor $Q_m$: 50), at least one metal selected among Cr, Cu, Mn and Sc or a compound containing the metal was added to the mixture after calcination. The mixture was pulverized by a ball mill, to which was then added a binder, and the resulting mixture was molded under a uniaxial pressure. This molded article was baked at from 1,000 to 1,300° C. by an electric furnace, thereby obtaining a dense piezoelectric ceramic pellet.

With respect to the obtained dense piezoelectric ceramic, in order to evaluate the piezoelectric characteristic, after mirror polishing the both surfaces, a gold sputtered film was applied thereto, thereby forming an electrode. According to this, a dielectric element using the piezoelectric ceramic of this invention was obtained. Subsequently, a polarization treatment was carried out in a silicone oil at from 100 to 180° C. under a condition at from 20 to 50 kV/cm. According to this, a piezoelectric element using the piezoelectric ceramic of this invention was obtained.

With respect to the thus obtained piezoelectric element, after allowing it to stand for 24 hours, its electromechanical coupling coefficient $k_p$, mechanical quality factor $Q_m$ and piezoelectric constant $d_{33}$ were measured. The electromechanical coupling coefficient $k_p$ and mechanical quality factor $Q_m$ were measured by a resonance-antiresonance method using an impedance analyzer. For the measurement of the piezoelectric constant $d_{33}$, a $d_{33}$ meter (YE2730A, manufactured by APC) was used. Also, for the measurement of a dielectric constant $\in_r$ of the thus obtained dielectric element, an impedance analyzer was used, and the measurement frequency was set up at 1 kHz. Also, a temperature of a peak of the dielectric constant was defined as a Curie temperature $T_c$.

Chemical composition, dielectric constant $\in_r$, electromechanical coupling coefficient $k_p$, piezoelectric constant $d_{33}$, mechanical quality factor $Q_m$ and Curie temperature $T_c$ of each of the piezoelectric ceramics of Examples 98 to 102 of this invention are shown in Table 3. Though a relative density of the obtained ceramic is slightly different depending upon the composition and manufacturing method, it was 95% or more in almost all of the samples.

TABLE 3

| Example No. | Additive component | Addition amount (% by weight) | Dielectric constant $\in_r$ | Electromechanical coupling coefficient $k_p$ (%) | Piezoelectric constant $d_{33}$ (pC/N) | Mechanical quality factor $Q_m$ | Curie temperature $T_c$ (° C.) |
|---|---|---|---|---|---|---|---|
| 98 | $MnO_2$ | 0.50 | 1675 | 43.2 | 235 | 90 | 250 |
| 99 | $MnO_2$ | 1.00 | 1594 | 38.3 | 215 | 131 | 247 |
| 100 | $Cr_3O_4$ | 1.00 | 1600 | 20.5 | 90 | 78.2 | 252 |
| 101 | $Sc_2O_3$ | 1.00 | 1649 | 30.5 | 160 | 85.5 | 253 |
| 102 | CuO | 1.00 | 1520 | 36.5 | 195 | 116 | 255 |

[Consideration]

It is noted that the piezoelectric ceramics of Examples 98 to 102 have a higher mechanical quality factor $Q_m$ as compared with that of Example 32. In particular, the piezoelectric ceramics of Example 99 and Example 102 have a mechanical quality factor $Q_m$ of 100 or more and are especially excellent.

The piezoelectric solid solution composition according to this invention is a ferroelectric substance. The piezoelectric ceramic which is a ferroelectric substance is also a pyroelectric ceramic and can be utilized as an infrared ray sensor or the like. With respect to Example 30 and Example 50, a generated pyroelectric current ($i_p$) was measured while raising a temperature (T) within the temperature range of from 25° C. to 75° C., and a pyroelectric coefficient p was measured by a static measurement method. The pyroelectric coefficient p was determined according to the following expression.

$$p=(i_p/A)(dT/dt)$$

Here, A represents an area of the electrode of the sample; and t represents a time. The pyroelectric current $i_p$ was measured by an ammeter (Model 486, manufactured by Keithley) while controlling a temperature rise rate dT/dt at 1.2° C./min.

Figure 2:
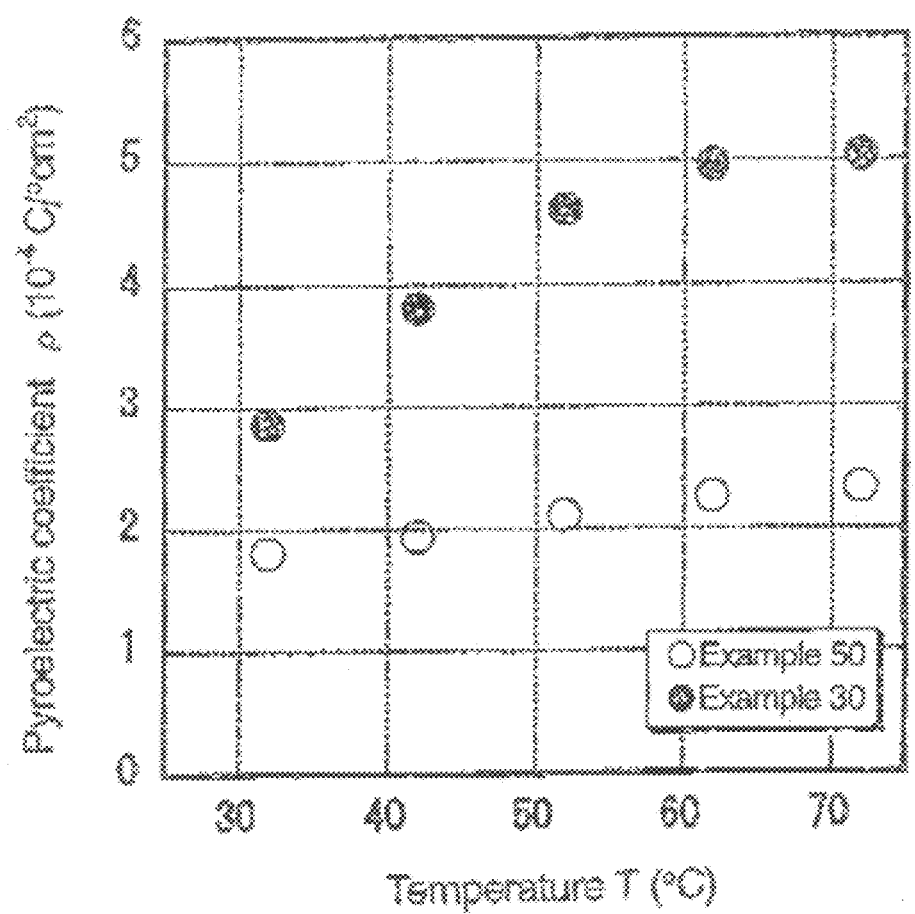
FIG. 2 shows a temperature dependency of a pyroelectric constant in Example 30 and Example 50.

A temperature dependency of the pyroelectric coefficient in Example 30 and Example 50 is shown in FIG. 2. The pyroelectric coefficient at room temperature (32° C.) is $2.85 \times 10^{-4}$ C/m$^{2.\circ}$ C. in Example 30 and $1.8 \times 10^{-4}$ C/m$^{2.\circ}$ C. in Example 50, respectively, both of which values are comparable to 1 to $5 \times 10^{-4}$ C/m$^{2.\circ}$ C. in PZT. Also, in both of the samples, the pyroelectric coefficient becomes large as the temperature raises, and the sensitivity as a sensor increases.

The invention claimed is:

1. A piezoelectric solid solution composition comprising, as a main component, a composition represented by the following general formula:

$$\{M_x(Na_yLi_zK_{1-y-z})_{1-x}\}_{1-m}\{(Ti_{1-u-v}Zr_uHf_v)_x(Nb_{1-w}Ta_w)_{1-x}\}O_3,$$

wherein M represents a combination of at least one member selected from the group consisting of $(Bi_{0.5}K_{0.5})$, $(Bi_{0.5}Na_{0.5})$ and $(Bi_{0.5}Li_{0.5})$ and at least one member selected from the group consisting of Ba, Sr, Ca and Mg; and x, y, z, u, v, w and m are in the following ranges: $0.06<x\leq0.3$, $0\leq y\leq1$, $0\leq z\leq0.3$, $0\leq(y+z)\leq1$, $0.6\leq u\leq0.75$, $0\leq v\leq0.75$, $0\leq w\leq0.2$, $0<(u+v)<1$ and $-0.06\leq m\leq0.06$, wherein the piezoelectric solid solution composition has a rhombohedral-tetragonal morphotropic phase boundary.

2. A piezoelectric ceramic obtained by sintering the piezoelectric solid solution composition according to claim 1.

3. A dielectric ceramic obtained by sintering the piezoelectric solid solution composition according to claim 1.

4. A pyroelectric ceramic obtained by sintering the piezoelectric solid solution composition according to claim 1.

5. The piezoelectric ceramic according to claim 2, which has a relative density of 95% or more.

6. The dielectric ceramic according to claim 3, which has a relative density of 95% or more.

7. The pyroelectric ceramic according to claim 4, which has a relative density of 95% or more.

8. A piezoelectric element containing the piezoelectric ceramic according to claim 2.

9. A dielectric element containing the dielectric ceramic according to claim 3.

10. A pyroelectric element containing the piezoelectric ceramic according to claim 4.

11. A piezoelectric element containing the piezoelectric ceramic according to claim 5.

12. A dielectric element containing the dielectric ceramic according to claim 6.

13. A pyroelectric element containing the piezoelectric ceramic according to claim 7.

14. The piezoelectric solid solution composition according to claim 1, wherein the composition comprises at least one metal selected from the group consisting of Ce, Cr, Dy, Er, Eu, Ga, Gd, Ge, Ho, In, La, Lu, Mn, Nd, Pr, Sc, Si, Sm, Tb, Tm, V, W, Y and Yb or a metal compound thereof.

* * * * *